(12) United States Patent
Zhu

(10) Patent No.: US 8,970,964 B2
(45) Date of Patent: Mar. 3, 2015

(54) PROJECTION OBJECTIVE LENS SYSTEM

(75) Inventor: Lirong Zhu, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 144 days.

(21) Appl. No.: 13/991,080

(22) PCT Filed: Nov. 25, 2011

(86) PCT No.: PCT/CN2011/082945
§ 371 (c)(1),
(2), (4) Date: May 31, 2013

(87) PCT Pub. No.: WO2012/072004
PCT Pub. Date: Jun. 7, 2012

(65) Prior Publication Data
US 2013/0250434 A1 Sep. 26, 2013

(30) Foreign Application Priority Data
Dec. 1, 2010 (CN) .......................... 2010 1 0567535

(51) Int. Cl.
| G02B 3/00 | (2006.01) |
| G02B 13/18 | (2006.01) |
| G02B 13/24 | (2006.01) |
| G03F 7/20 | (2006.01) |
| G02B 13/14 | (2006.01) |

(52) U.S. Cl.
CPC ............... G02B 13/18 (2013.01); G02B 13/24 (2013.01); G03F 7/70241 (2013.01); G02B 13/143 (2013.01)
USPC .......................................................... 359/649

(58) Field of Classification Search
USPC ...................................................... 359/649
See application file for complete search history.

(56) References Cited

U.S. PATENT DOCUMENTS

| 6,700,645 B1 | 3/2004 | Shigematsu |
| 6,806,942 B2 | 10/2004 | Schuster et al. |
| 2003/0137745 A1 | 7/2003 | Takahashi |
| 2006/0170897 A1* | 8/2006 | Kneer et al. .................. 355/67 |
| 2010/0085550 A1 | 4/2010 | Aoki |

FOREIGN PATENT DOCUMENTS

| CN | 1417610 A | 5/2003 |
| CN | 1928610 A | 3/2007 |
| CN | 101101450 A | 1/2008 |
| CN | 101320122 A | 12/2008 |
| JP | 2000171706 A | 6/2000 |
| JP | 2001201682 A | 7/2001 |
| JP | 2002365538 A | 12/2002 |

* cited by examiner

*Primary Examiner* — James Jones
(74) *Attorney, Agent, or Firm* — Muncy, Geissler, Olds & Lowe, P.C.

(57) ABSTRACT

A projection objective lens system includes from an object plane to an image plane: a first lens group (S1) with a positive refractive power; a second lens group (S2) with a negative refractive power; a third lens group (S3) with a positive refractive power; a fourth lens group (S4) with a negative refractive power; and a fifth lens group (S5) with a positive refractive power being divided into two sub-lens groups. An aperture stop (AS) is provided between the two sub-lens groups. The following conditions are met: $0.12<|L/f|<0.4$, and $\Delta R/R<1\%$, wherein, f is an effective focal length of the system, L is a distance between the object and image planes, $\Delta R$ represents a difference between radii at the aperture stop of a marginal field beam bundle and a central field beam bundle, and R represents a radius at the aperture stop of a central field beam bundle.

16 Claims, 4 Drawing Sheets

PROJECTION OBJECTIVE LENS SYSTEM

TECHNICAL FIELD

The present invention relates in general to a projection objective lens system, and more particularly, to a projection objective lens system for use in stepper-type lithography tools for the fabrication of semiconductor chips and other miniaturized devices.

BACKGROUND

U.S. Pat. No. 6,806,942 proposed a so-called three-bulge two-waist projection objective system using a light source having a wavelength band with a relative width $\delta\lambda/\lambda$ of larger than 0.002, or even larger than 0.005. In the system, the three bulges each have a positive refractive power and the two waists each have a negative refractive power. By selecting suitable materials, relatively high chromatic corrections are achieved, and the stability of the system is improved.

FIG. 1 together with FIG. 2 shows the projection objective provided by the U.S. Pat. No. 6,806,942, which includes 31 optical elements which can be divided into 5 groups: G1, G2, G3, G4 and G5. G1-G4 are illustrated in FIG. 1, wherein G1 is consisted of five lenses, namely the first to fifth lenses, among which, the first and third lenses are made of a high-transmittance material and the second lens is a negative lens; G2 is consisted of four lenses, namely the sixth to ninth lenses, all of which are negative lenses and the ninth lens is made of a high refractive index material; G3 is consisted of four lenses, namely the tenth to thirteenth lenses, all of which are positive lenses and the thirteenth lens is made of a high-transmittance material; G4 is consisted of the fourteenth to sixteenth lenses, all of which are negative lenses and are made of a high refractive index material. G5 is illustrated in FIG. 2, which is consisted of the seventeenth to thirty-first lenses, among which the twentieth lens is an optical flat and the twenty-second, twenty-seventh, thirtieth and thirty-first lenses are made of a high refractive index material. In FIG. 1, there is further indicated: an optical axis 107; an object plane 103; a central field point 113; an upper marginal beam 109 as well as a lower marginal beam 111 of the central field point; an outermost field point 121; and an upper marginal beam 115 as well as a lower marginal beam 119 of the outermost field point. Moreover, in FIG. 2, a system diaphragm 123 and an image plane 105 are further indicated.

Nevertheless, a projection objective with such design has a drawback that the system has a relatively poor telecentricity, especially on an object side. This causes the system to be extremely sensitive to the unevenness of a reticle surface, which unevenness may be generated during the fabrication of the reticle. As a result, after it is magnified by the projection objective, even a tiny convex or concave on the reticle surface may lead to a great change in the quality and in particular the distortion of an associated image formed on a wafer surface.

SUMMARY OF THE INVENTION

The objective of the present invention is to provide a projection objective lens system having a dual-telecentric, large-aperture structure, for imaging a pattern on an object plane onto an image plane to avoid the issue of reduced imaging quality on a wafer surface caused by magnification of fine convexes and concaves on a reticle surface in a conventional projection objective.

A projection objective according to the present invention includes, from an object plane to an image plane: a first lens group having a positive refractive power; a second lens group having a negative refractive power; a third lens group having a positive refractive power; a fourth lens group having a negative refractive power; a fifth lens group having a positive refractive power and including a first sub-lens group and a second sub-lens group; and an aperture stop positioned between the first and second sub-lens groups, wherein the formulae $0.12 \langle |L/f| \langle 0.4$ and $\Delta R/R < 1\%$ are satisfied, where f is an effective focal length of the projection objective lens system, L is a distance between the object and image planes, $\Delta R$ represents a difference between radii at the aperture stop of a marginal field beam bundle and a central field beam bundle, and R represents a radius at the aperture stop of a central field beam bundle.

Further, the first lens group may include: a first sub-lens group having a negative refractive power and including at least one negative lens with an aspheric front surface; and a second sub-lens group having a positive refractive power and including at least three lenses.

Further, the second lens group may include at least three negative lenses.

Further, the third lens group may include at least three positive lenses.

Further, the fourth lens group may include at least three positive lenses, and a last lens of the fourth lens group has an aspheric rear surface.

Further, all lenses of the first sub-lens group of the fifth lens group may be positive lenses, among which, the one disposed closest to the aperture stop has: a front surface bending away from the aperture stop, the front surface having an apex far apart from the aperture stop and a positive radius of curvature; and a rear surface bending away from the aperture stop, the rear surface having an apex far apart from the aperture stop and a radius of curvature greater than that of the front surface. Moreover, the second sub-lens group may include a negative lens which has an aspheric rear surface.

Further, the projection objective may further include: a first flat plate disposed between the object plane and the first lens group; a second flat plate disposed between the aperture stop and the second sub-lens group of the fifth lens group; and a third flat plate disposed between the fifth lens group and the image plane. The first and third flat plates provide cover glasses for protecting the internal optical lenses from external impacts and the second flat plate serves as a spare element which can be polished to compensate the imaging quality of the projection objective that has been affected by other optical members.

The projection objective lens system may include at least two types of optical materials including high refractive index materials which have a refractive index of greater than 1.6 at a working wavelength and low refractive index materials which have a refractive index of smaller than 1.6 at the working wavelength. Additionally, the negative lens of the first sub-lens group of the first lens group may be made of low refractive index materials, and the second sub-lens group of the first lens group includes at least one lens made of a high refractive index material. Moreover, at least two of the negative lenses of the second lens group may be made of high refractive index materials. in addition, at least one of the positive lenses of the third lens group may be made of a high refractive index material. Furthermore, at least two of the negative lenses of the fourth lens group may be made of high refractive index materials. Separately, all lenses of the first sub-lens group of the fifth lens group are formed of a low refractive index material, and the negative lens of the second sub-lens of the fifth lens group that has an aspheric surface is formed of a high refractive index material and has a free diameter of no smaller than 0.9·Dmax.

Further, the projection objective may have an object-side working distance that is greater than 40 mm, an image-side working distance that is greater than 10 mm, an angle between an image formed and an optical axis that is smaller than 3 mrad, and an image-side numerical aperture that is greater than 0.5.

More preferably, the projection objective may have an object-side working distance that is greater than 45 mm, an image-side working distance that is greater than 12 mm, an angle between an image formed and an optical axis that is smaller than 1 mrad, a ratio of a distance between the object and image planes to an effective focal length of the projection objective that is from 0.15 to 0.3, a ratio of a difference between radii at the aperture stop of a marginal field beam bundle and a central field beam bundle to a radius at the aperture stop of a central field beam bundle that is smaller than 0.5%, and an image-side numerical aperture that is greater than 0.65.

Further, the projection objective lens system may be used in a micro-lithography system.

The present invention can provide a projection objective which has a numerical aperture as high as greater than 0.65 and a maximum spectral width of 5 nm and is thus suited for light of the ultraviolet spectral range, and particularly for light of I-line, Moreover, the projection objective functions similar to a dual-telecentric system. That is, on the object side, a main beam emitted from each field point on the object plane enters the first optical element in a direction parallel to the optical axis; while on the image side, the main beam emitted from each field point exits the system quasi-parallel to the optical axis at an angle with respect to the optical axis of smaller than 3 mrad, or even smaller than 1 mrad in some cases, and is thereafter imaged on the image plane. Therefore, this projection objective is non-sensitive to the unevenness of a reticle surface, i.e., tiny convexes or concaves on the reticle surface will not cause significant changes in the imaging quality and in particular the distortion of an associated image formed on a wafer surface.

Moreover, the ratio of a distance L between the object and image planes to an effective focal length f of the projection objective lens system is in a range of 0.12 to 0.4, and more preferred, in a range of 0.15 to 0.3, this facilitates to control the distortion to a certain extent and ensures compactness of the structure of the system.

In addition, the ratio of a difference between radii at the aperture stop of a marginal field beam bundle and a central field beam bundle to a radius at the aperture stop of a central field beam bundle is smaller than 1%, and more preferred, is smaller than 0.5%, this facilitates to reduce pupil obscuration and helps to obtain an even light energy distribution throughout the whole system.

Furthermore, this projection objective can be widely used at 280 nm technology node, and in particular, at 240 nm technology node.

DETAILED DESCRIPTION

Several example embodiments of the present invention will be described below with reference to the accompanying drawings. In these figures, parts common with the conventional technologies and well known in this art are not illustrated and relevant description of them are also not given for the convenience in description and giving emphasis on describing this invention.

The projection objective according to the present invention has a total length of not greater than 1200 mm and is suited for light of the I-line with a wavelength band of 5 nm; a magnification ratio of 0.25; an image-side numerical aperture of greater than 0.5, more preferred, of greater than 0.65; an image-side diagonal field of greater than 56 mm; a ratio of a distance L between an object plane and an image plane to an effective focal length f, namely, L/f, within a range of 0.12〈|L/f|〈0.4, more preferred, within a range of 0.15〈|L/f|〈0.3. On an object side, a main beam emitted from each field point on the object plane enters a first optical element in a direction parallel to the optical axis; while on the image side, the main beam emitted from each field point exits the projection objective in a direction quasi-parallel to the optical axis at an angle with respect to the optical axis of smaller than 3 mrad, more preferred, of smaller than 1 mrad, and is thereafter imaged on the image plane. An object-side working distance is greater than 40 mm, and more preferred to be greater than 45 mm; and an image-side working distance is greater than 10 mm, and more preferred to be greater than 12 mm. Herein, the object-side working distance refers to a distance from the object plane to an optical plate disposed on the object side in the case that the object side is protected by this optical plate, or refers to a shortest distance along the optical axis from the object plane to the first optical lens in the case that the object side is not protected by an optical plate. The image-side working distance refers to a distance from an optical plate disposed on the image side to the image plane in the case that the image side is protected by the optical plate, or refers to a shortest distance along the optical axis from the last optical element to the image plane in the case that the image side is not protected by an optical plate.

Figure 1:
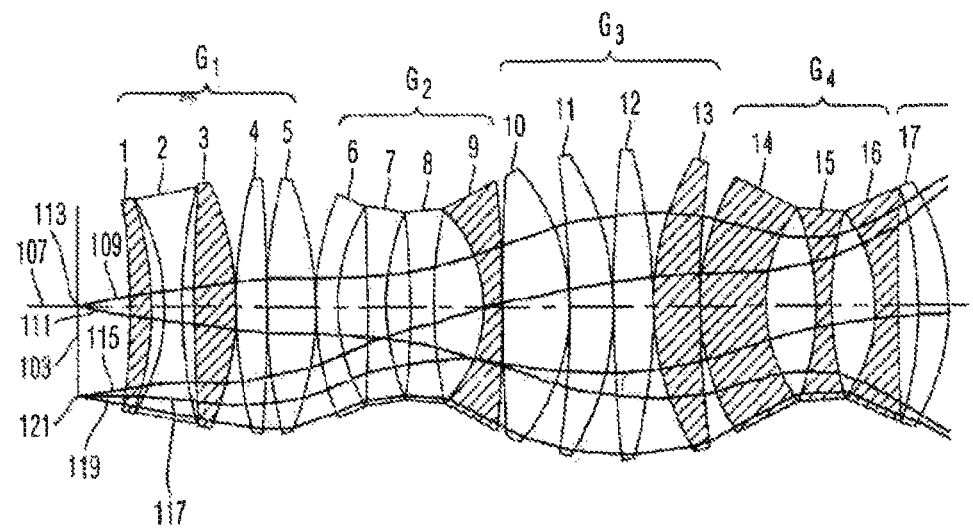
FIG. 1 and FIG. 2 schematically illustrate a projection objective provided by the U.S. Pat. No. 6,806,942.
Figure 2:
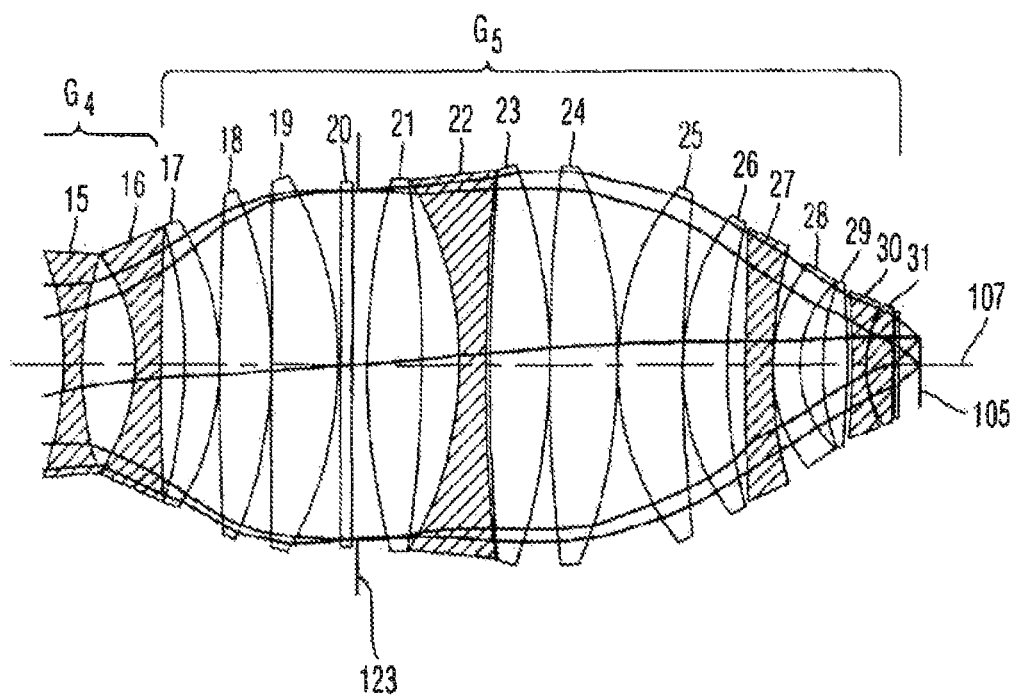
Figure 3:
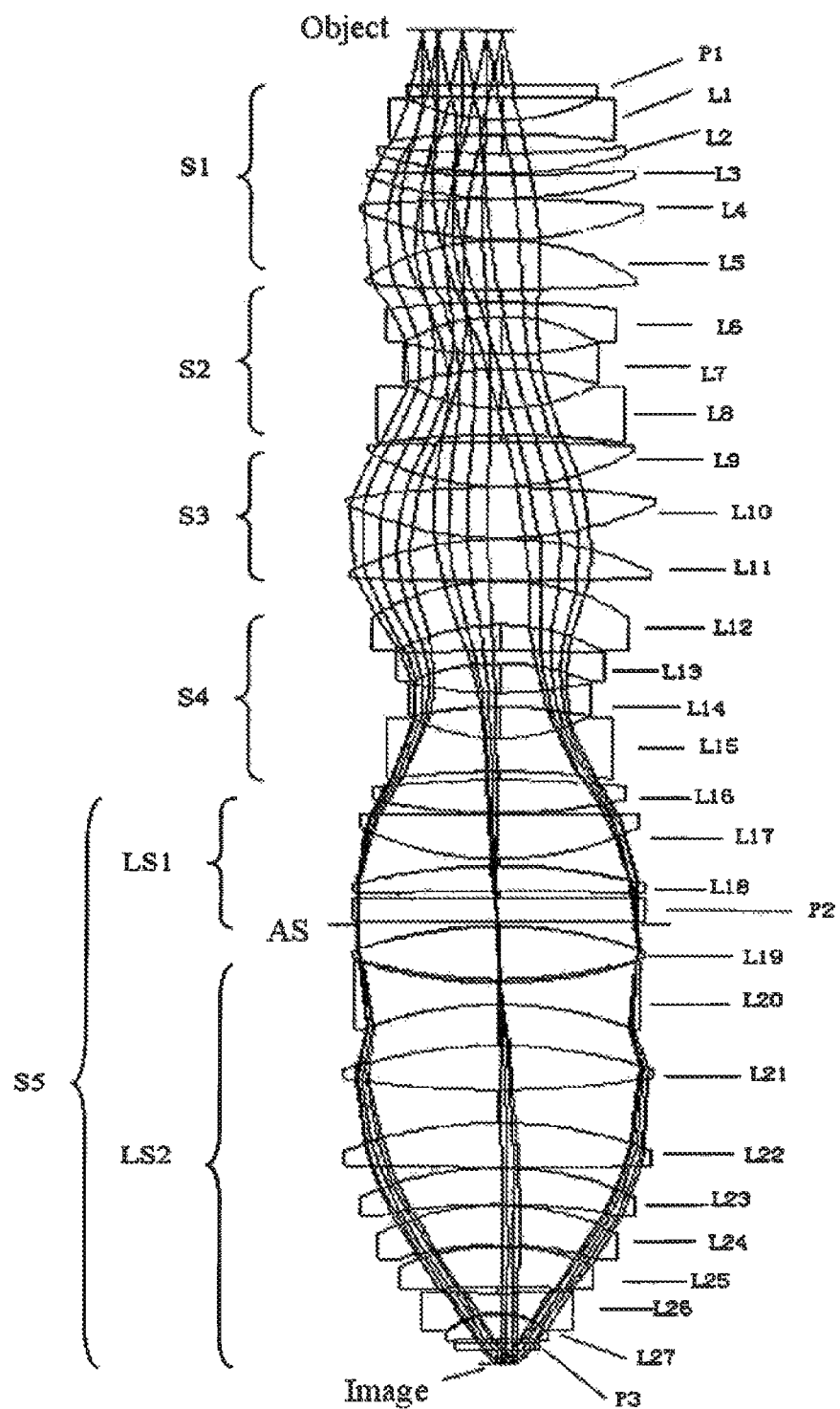
FIG. 3 is a schematic illustration of a projection objective according to an embodiment of the present invention.

FIG. 3 schematically illustrates a projection objective constructed according to an embodiment of the present invention. In FIG. 3, "Object" and "Image" indicate an object plane and an image plane, respectively, and AS indicates an aperture stop. The projection objective consists of 30 optical elements including 27 optical lenses and three optical plates P1, P2 and P3. These optical elements are successively disposed in the direction that light travels in the objective and can be divided into five groups according to a distribution of their refractive powers: a first lens group S1, a second lens group S2, a third lens group S3, a fourth lens group S4 and a fifth lens group S5. The first lens group S1 has a positive refractive power and includes five optical lenses L1 to L5, among which, the lens L1 is a negative lens made of a low refractive index material with a refractive index of smaller than 1.6 and has an aspheric front surface 1 which has a sag difference of smaller than 0.3 mm from that of a best-fit sphere (BFS) and functions to inhibit the generation of higher-order aberrations so as to facilitate the correction of distortions at the rear stages. The second lens group S2 has a negative refractive power and includes three negative lenses L6 to L8, among which, the lenses L7 and L8 are made of a high refractive index material with a refractive index of greater than 1.6. The third lens group S3 has a positive refractive power and includes three positive lenses L9 to L11, all of which are made of low refractive index materials with a refractive index of smaller than 1.6. The fourth lens group S4 has a negative refractive power and includes four optical lenses L12 to L15, among which, the lenses L13 and L14 are made of high refractive index materials with a refractive index n of greater than 1.6, and the lens L15 is made of a low refractive index material with a refractive index n of smaller than 1.6 and has an aspheric rear surface which functions to correct field-related aberrations. The fifth lens group S5 has a positive refractive power and includes twelve optical lenses L16 to L27 and an optical plate P2, which can be further divided into two sub-lens groups LS1 and LS2 according to their functions. Between the sub-lens groups LS1 and LS2 is disposed an aperture stop AS. The first sub-lens group LS1 includes three optical lenses L16 to L18 and the optical plate P2. All optical lenses of the first sub-lens group LS1 are positive lenses made of low refractive index materials with a refractive index of smaller than 1.6, among which, the positive lens L18 which is disposed closest to the aperture stop AS has a first surface bending away from the aperture stop AS; the first surface has an apex far apart from the aperture stop AS and has a positive radius of curvature. A second surface of the lens L18 also bends away from the aperture stop AS; the second surface has an apex far apart from the aperture stop AS and has a radius of curvature greater than that of the first surface. Such design can effectively correct Petzval field curvature at the aperture stop. The second sub-lens group LS2 includes nine optical lenses L19 to L27, among which: all lenses other than lens L20 are made of a low refractive index material with a refractive index of smaller than 1.6; the lens L20 is a negative lens which is made of a high refractive index material with a refractive index of greater than 1.6 and has an aspheric rear surface which has a free diameter of not smaller than 0.9 Dmax. A main function of lens L20 is to correct aberrations related with the aperture stop. The ratio of a difference between radii at the aperture stop of a marginal field beam bundle (i.e. a beam bundle emanated from a marginal field point) and a central field beam bundle (i.e. a beam bundle emanated from a central field point) to a radius at the aperture stop of a central field beam bundle is smaller than 1%, and more preferred, is smaller than 0.5%

The three parallel plates are disposed respectively at positions of the first lens closest to the object plane, the lens upstream to the aperture stop, and the last lens closest to the image plane. Both the first and last optical plates P1 and P3 serve as cover glasses for protecting the internal optical lenses from external impacts. The plate plate P2 upstream to the aperture stop serves as a spare element which can be polished if necessary to compensate the imaging quality of the system when such quality is affected by processing errors of other optical elements.

Specific parameters of the projection objective lens system are given in the following Tables 1 and 2.

TABLE 1

|  | Radius of Curvature | Thickness/Interval | Material |
|---|---|---|---|
| Object Plane | infinity | 45 |  |
|  | infinity | 10 | SIO2_SPECIAL |
|  | infinity | 21.291784 |  |
| Aspheric Surface 1 | −127.664 | 13.0000008 | SIO2_SPECIAL |
|  | 403.7343 | 26.6211634 |  |
|  | −778.817 | 22.199007 | SFSL5Y_OHARA |
|  | −232.075 | 0.90000085 |  |

TABLE 1-continued

|  | Radius of Curvature | Thickness/Interval | Material |
|---|---|---|---|
|  | −2144.44 | 21.2984307 | PBL25Y_OHARA |
|  | −285.97 | 0.90000058 |  |
|  | 410.3625 | 38.2095441 | SFSL5Y_OHARA |
|  | −335.117 | 0.9 |  |
|  | 560.3234 | 43.9689786 | SIO2_SPECIAL |
|  | −1515.89 | 0.90050112 |  |
|  | 375.3889 | 13.0000095 | SFSL5Y_OHARA |
|  | 119.1344 | 25.7368229 |  |
|  | −333.52 | 13.0000001 | PBL1Y_OHARA |
|  | 164.3053 | 37.3304366 |  |
|  | −129.505 | 13.0000006 | PBL25Y_OHARA |
|  | 432.1449 | 11.0086134 |  |
|  | 2259.792 | 33.6790584 | SFSL5Y_OHARA |
|  | −173.011 | 0.9000002 |  |
|  | 691.1496 | 42.6063845 | SFSL5Y_OHARA |
|  | −190.485 | 0.9 |  |
|  | 213.3955 | 21.8899283 | PBL25Y_OHARA |
|  | 1048.559 | 0.90000012 |  |
|  | 117.877 | 38.580341 | SFSL5Y_OHARA |
|  | 102.0075 | 23.4251256 |  |
|  | 338.7309 | 13 | SFSL5Y_OHARA |
|  | 113.6737 | 31.9399276 |  |
|  | −177.806 | 13 | SFSL5Y_OHARA |
|  | 217.5526 | 34.029126 |  |
|  | −98.9313 | 28.5786433 | PBL25Y_OHARA |
| Aspheric Surface 2 | 1514.817 | 3.22171727 |  |
|  | 779.0035 | 32.2685968 | SFSL5Y_OHARA |
|  | −214.491 | 0.90000019 |  |
|  | −499.07 | 32.6496724 | SFSL5Y_OHARA |
|  | −158.71 | 0.9 |  |
|  | 51.06465 | 36.8371529 | SFSL5Y_OHARA |
|  | −1412.52 | 8.08037644 |  |
|  | 1.00E+18 | 20 | SIO2_SPECIAL |
|  | 1.00E+18 | 34.5117836 |  |
| Aperture Stop | 1.00E+18 | −2.5 |  |
|  | 303.9157 | 36.1734063 | SFSL5Y_OHARA |
|  | −519.266 | 9.93615773 |  |
|  | −305.013 | 20 | PBL25Y_OHARA |
| Aspheric Surface 3 | 229.4571 | 14.8367387 |  |
|  | 417.609 | 28.6769175 | SFSL5Y_OHARA |
|  | −217.042 | 10.3837664 |  |
|  | 362.6817 | 29.705095 | SFSL5Y_OHARA |
|  | −1349.77 | 16.524509 |  |
|  | 250.2507 | 36.9088222 | SFSL5Y_OHARA |
|  | −549.975 | 0.9000001 |  |
|  | 154.5506 | 40.7076006 | SFSL5Y_OHARA |
|  | 503.9516 | 0.90000001 |  |
|  | 308.7465 | 44.3719893 | SFSL5Y_OHARA |
|  | 1215.241 | 0.9 |  |
|  | −4661.36 | 36.9312861 | SFSL5Y_OHARA |
|  | 53.79116 | 3.6355942 |  |
|  | 49.68648 | 21.7953991 | SFSL5Y_OHARA |
|  | 311.6276 | 4.44934018 |  |
|  | infinity | 6 | SIO2_SPECIAL |
|  | infinity | 12 |  |
| Image Plane | infinity | 0 |  |

TABLE 2

|  | K | A | B | C | D |
|---|---|---|---|---|---|
| Aspheric Surface 1 | 0 | −1.31E−08 | −7.15E−13 | −3.35E−17 | −5.51E−21 |
| Aspheric Surface 2 | 0 | 1.90E−08 | −9.50E−13 | 1.84E−17 | −2.24E−23 |
| Aspheric Surface 3 | 0 | 1.00E−08 | −1.21E−13 | −6.13E−18 | −3.10E−22 |

Figure 4:
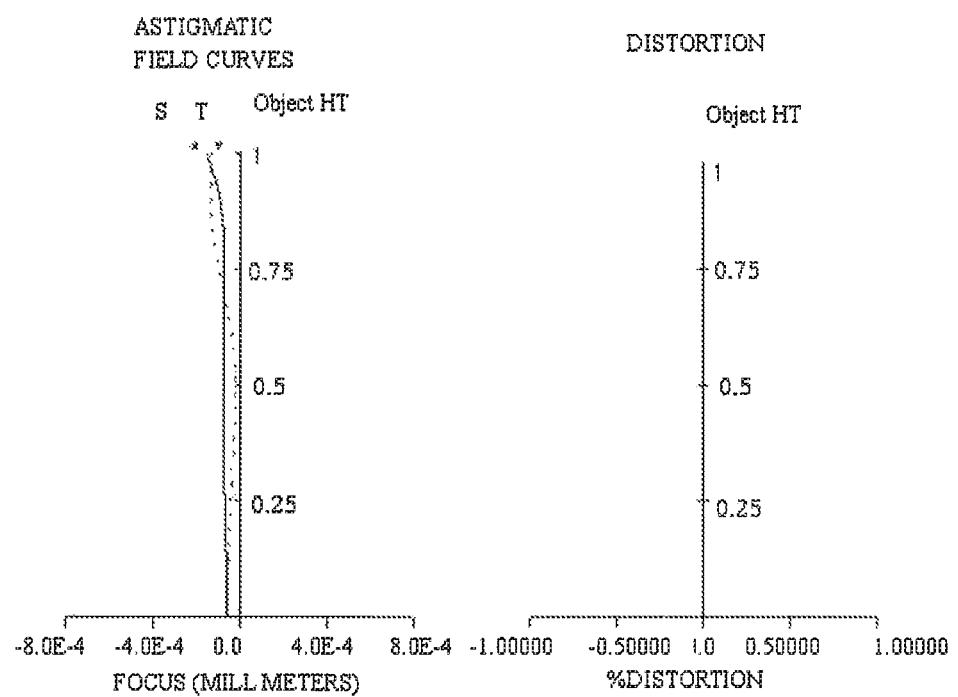
FIG. 4 illustrates a near-axis field curvature and distortion of the projection objective of FIG. 3.

FIG. 4 shows a near-axis field curvature and distortion of the projection objective of FIG. 3. As illustrate, the structure has a small value of field curvature and astigmatism: the value of field curvature is smaller than 100 nm and the value of astigmatism is smaller than 70 nm.

Figure 5:
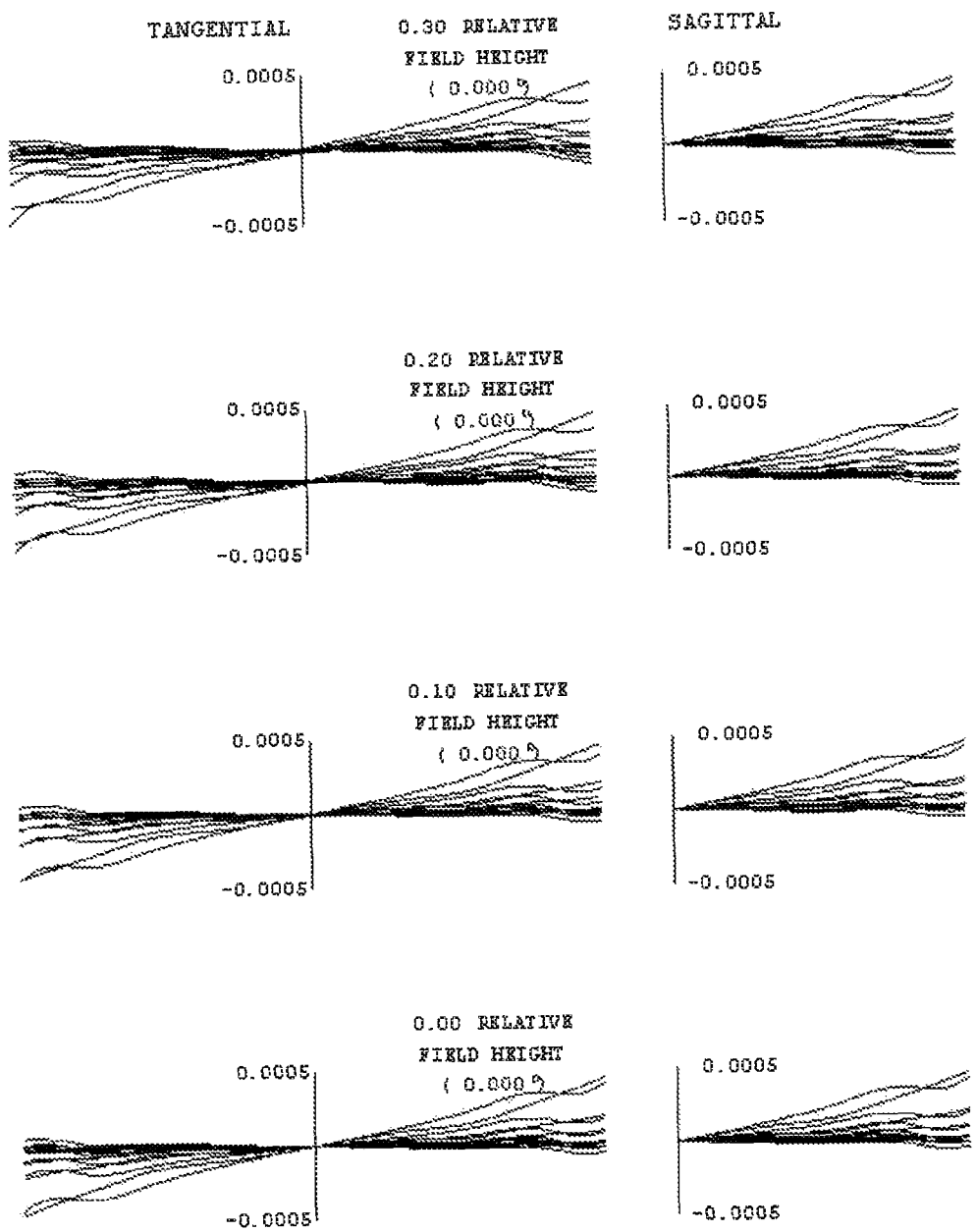
FIG. 5 shows aberration curves of the projection objective of FIG. 3.

Moreover, FIG. 5 shows aberration curves of the projection objective of FIG. 3. As illustrated, all major aberrations have been well corrected and only few spherochromatic aberrations are remained.

The projection objectives described in the description are merely several preferable embodiments of the invention which are provided solely for the purpose of describing but not limiting the invention in any way. Any technical solutions which are obtained by those skilled in the art through logical analysis, reasoning or limited experiment in light of the conception of the invention are within the scope as defined in the appended claims.

What is claimed is:

1. A projection objective lens system comprising, from an object plane to an image plane:
    a first lens group having a positive refractive power;
    a second lens group having a negative refractive power;
    a third lens group having a positive refractive power;
    a fourth lens group having a negative refractive power;
    a fifth lens group having a positive refractive power and including a first sub-lens group and a second sub-lens group; and
    an aperture stop positioned between the first sub-lens group and the second sub-lens group;
    wherein the projection objective lens system includes at least two types of optical materials including high refractive index materials having a refractive index of greater than 1.6 at a working wavelength and low refractive index materials having a refractive index of smaller than 1.6 at a working wavelength;
    wherein all lenses of the first sub-lens group are positive lenses formed of low refractive index materials;
    wherein the second sub-lens group includes a negative lens which has an aspheric rear surface and is formed of a high refractive index material; and
    wherein the following formula is satisfied:
    $\Delta R/R < 1\%$,
    where $\Delta R$ represents a difference between a radius at the aperture stop of a marginal field beam bundle and a radius at the aperture stop of a central field beam bundle, and R represents a radius at the aperture stop of a central field beam bundle.

2. The projection objective lens system according to claim 1, wherein the first lens group includes: a first sub-lens group having a negative refractive power and including at least one negative lens with an aspheric front surface; and a second sub-lens group having a positive refractive power and including at least three lenses.

3. The projection objective lens system according to claim 2, wherein the negative lens of the first sub-lens group of the first lens group is made of a low refractive index material, and the second sub-lens group of the first lens group includes at least one lens made of a high refractive index material.

4. The projection objective lens system according to claim 1, wherein the second lens group includes at least three negative lenses.

5. The projection objective lens system according to claim 4, wherein at least two of the negative lenses of the second lens group are made of high refractive index materials.

6. The projection objective lens system according to claim 1, wherein the third lens group includes at least three positive lenses.

7. The projection objective lens system according to claim 6, wherein at least one of the positive lenses of the third lens group is made of a high refractive index material.

8. The projection objective lens system according to claim 1, wherein the fourth lens group includes at least three negative lenses; and a last lens of the fourth lens group has an aspheric rear surface.

9. The projection objective lens system according to claim 8, wherein at least two of the negative lenses of the fourth lens group are made of high refractive index materials.

10. The projection objective lens system according to claim 1, wherein a positive lens of the first sub-lens group of the fifth lens group disposed closest to the aperture stop has: a front surface bending away from the aperture stop, an apex of the front surface being far apart from the aperture stop, a radius of curvature of the front surface being positive; and a rear surface bending away from the aperture stop, an apex of the rear surface being far apart from the aperture stop, a radius of curvature of the rear surface being greater than that of the front surface.

11. The projection objective lens system according to claim 1, further comprising: a first flat plate disposed between the object plane and the first lens group; a second flat plate disposed between the aperture stop and the first sub-lens group of the fifth lens group; and a third flat plate disposed between the fifth lens group and the image plane.

12. The projection objective lens system according to claim 11, wherein the first and third flat plates provide cover glasses for protecting the internal optical lenses from external impacts, and the second flat plate serves as a compensating element which can be polished to compensate the imaging quality of the system that has been affected by other optical elements.

13. The projection objective lens system according to claim 1, wherein a free diameter of the negative lens of the second sub-lens group of the fifth lens group that has an aspheric surface is no smaller than 0.9 Dmax, where Dmax is a greatest free diameter of all lenses.

14. The projection objective lens system according to claim 1, wherein the system has an object-side working distance that is greater than 40 mm, an image-side working distance that is greater than 10 mm, and an image-side numerical aperture that is greater than 0.5.

15. The projection objective lens system according to claim 1, wherein the system has an object-side working distance that is greater than 45 mm, an image-side working distance that is greater than 12 mm, an angle between an image formed and an optical axis that is smaller than 1 mrad, a ratio of a distance between the object and image planes to an effective focal length of the projection objective lens system that is within the range of 0.15 to 0.3, a ratio of a difference between radii at the aperture stop of a marginal field beam bundle and a central field beam bundle to a radius at the aperture stop of a central field beam bundle that is smaller than 0.5%, and an image-side numerical aperture that is greater than 0.65.

16. A micro-lithography system employing the projection objective lens system according to claim 1.

* * * * *